United States Patent
Ichimaru et al.

[11] Patent Number: 6,130,925
[45] Date of Patent: Oct. 10, 2000

[54] FREQUENCY SYNTHESIZER

[75] Inventors: Kouzou Ichimaru, Kunisaki-machi; Yohichi Kawahara, Beppu, both of Japan

[73] Assignee: Texas Instruments Incorporated, Dallas, Tex.

[21] Appl. No.: 09/212,959

[22] Filed: Dec. 16, 1998

[30] Foreign Application Priority Data

Dec. 26, 1997 [JP] Japan ................................ 9-367937

[51] Int. Cl.[7] .................................................. H03D 3/24
[52] U.S. Cl. ...................... 375/376; 375/374; 455/260; 329/325; 332/127
[58] Field of Search ................................. 375/354, 371, 375/373, 374, 375, 376; 455/260; 329/307, 325; 332/127; 331/25, 1 A

[56] References Cited

U.S. PATENT DOCUMENTS 5,180,993 1/1993 Dent ......................................... 331/16
5,692,023 11/1997 Clark ...................................... 375/376
5,701,598 12/1997 Atkinson ............................... 455/161.2
5,834,987 11/1998 Dent ....................................... 332/127

Primary Examiner—Stephen Chin
Assistant Examiner—Lenny Jiang
Attorney, Agent, or Firm—William B. Kempler; Frederick J. Telecky, Jr.

[57] ABSTRACT

The purpose of the present invention is to provide a frequency synthesizer which does not have spurious components. Automatic reference correcting circuit 4 is provided to frequency synthesizer 1 which changes the frequency division value of the divider and makes the frequency of external output signal (OUT) into a value equal to the frequency of the reference clock signal multiplied by the average frequency division value, charge pump circuit 35 measures the ripple component contained in the output control signal, and ripple correcting circuit 39 forms compensation current, which is superimposed on the control signal in order to minimize the ripple component. If composed for control circuit 55 to obtain the optimum compensation current and output to ripple correcting circuit 39 while negative feedback which minimizes the ripple component is being formed, output signal (OUT) which does not have spurious components can be obtained.

9 Claims, 4 Drawing Sheets

FREQUENCY SYNTHESIZER

FIELD OF THE INVENTION

The present invention relates to the technical field of frequency synthesizers and in particular it relates to a technology for eliminating the spurious components of a frequency synthesizer which cyclically changes the counter frequency division value.

BACKGROUND OF THE INVENTION

In recent years, a frequency synthesizer with a high-speed lockup operation has been sought for cellular telephones, etc. Code 101 in FIG. 6 is an example of a frequency synthesizer of the conventional technology and is provided within a semiconductor device which composes the transmitting/receiving circuit of a cellular telephone.

This frequency synthesizer 101 has oscillator 131, frequency divider 132, clock signal generator 133, phase comparator 134, charge pump circuit 135, low-pass filter 136, voltage generating circuit 137, fractional frequency division control circuit 138, and ripple correcting circuit 139.

Charge pump 135 outputs control signal to oscillator 131 via low-pass filter 136 and oscillator 131 outputs external output signal (OUT) with a frequency complying with the input control signal to frequency divider 132 and other circuits within the semiconductor device provided with said frequency synthesizer 101.

Frequency divider 132 controls the frequency division value according to fractional frequency division control circuit 138; external output signal (OUT) input to frequency divider 132 is frequency divided according to the frequency division value, and output to phase comparator 134 as a comparison signal.

The frequency divided signal and reference clock signal output by clock signal generator 133 are input to phase comparator 134, and phase comparator 134 compares the phase and outputs the comparison result to charge pump circuit 135.

Charge pump circuit 135 outputs a control signal to oscillator 131 via low-pass filter 136 and, as a result, oscillator 131 changes the frequency of external output signal (OUT) according to the input control signal, and the comparison signal is brought in phase with the reference clock signal. Incidentally, the channel interval is set, for example, at 25 kHz or 12.5 kHz with 900 MHz as the reference frequency in a cellular telephone. Therefore, it is necessary to create an external output signal (OUT) with 12.5 kHz or 25 kHz intervals with 900 MHz as the reference frequency to yield 900.025 MHz, 900.050 MHz, . . . , etc.

On the other hand, the reference clock signal must have a high frequency in order to make the response speed fast. Therefore, in aforementioned frequency synthesizer 101, fractional frequency division control circuit 138 changes the frequency division value of frequency divider 132 cyclically so that the frequency of external output signal (OUT) is equal to the frequency of the reference clock signal multiplied with the average frequency division value.

For example, when using a reference clock signal with a frequency of 225 kHz, if the frequency division value of frequency divider 132 is 4000 during 8 cycles of the reference clock signal and 4001 only during the next cycle, the average frequency value which averaged one cycle of frequency division value change (9 cycles of reference clock signal) becomes 4000+1/9 and the frequency of the external output signal (OUT) becomes 900.025 MHz from 225 kHz×(4000+1/9)=900.025 MHz.

Also, if the frequency division value during the second cycle of the reference clock signal is 4001 and the remaining 7 cycles is 4000, the average frequency division value becomes 4000+2/9 and the frequency of external output signal (OUT) becomes 900.050 MHz. By thus changing the frequency division value cyclically, external output signal (OUT) of the necessary frequency can be obtained from a reference clock signal of relatively high frequency.

However, when changing the frequency division value cyclically as described above, the phase of the comparison signal continues to change cyclically even after external output signal (OUT) has been locked up and the comparison signal and the reference clock signal are out of phase.

Therefore, a signal complying with the phase shift is output from phase comparator 134 and ripple current of a charge value complying with the phase shift continues to be output from charge pump circuit 135. Codes ($A_1$) to ($A_8$) in FIG. 7 are examples of ripple current and if the magnitude of ripple current ($A_4$) is taken as the minimum unit, each ripple current ($A_1$) to ($A_8$) is respectively 7 times, 5 times, 3 times, 1 times, −1 times, −3 times, −5 times, and −7 times the minimum unit.

This type of ripple current generates spurious components in external output signal (OUT). And, in addition to adversely affecting the receiving characteristics of communication equipment such as cellular telephone, etc., it creates problems during transmission, which is disadvantageous.

Therefore, a countermeasure is used even in said frequency synthesizer 101 of the conventional technology, and voltage generating circuit 137 and ripple correcting circuit 139 are provided. This ripple correcting circuit 139 has plural capacitors 141 and switches 142 that connect capacitors 141 to voltage generating circuit 137 and is designed so that fractional frequency division control circuit 138 selects capacitor 141 according to the magnitude of the ripple current, closes switch 142, and connects the corresponding capacitor 141 to voltage generating circuit 137.

Then, when switch 142 is closed and reference voltage output by voltage generating circuit 137 is applied to selected capacitor 141, compensation current of equal magnitude is formed with opposite polarity to the ripple current. This compensation current is indicated by codes ($B_1$) to ($B_8$) in FIG. 7. When compensation currents ($B_1$) to ($B_8$) are superimposed on the output of charge pump circuit 135, ripple currents ($A_1$) to ($A_8$) are cancelled.

However, even if an attempt is made to cancel the ripple current by forming a compensation current of equal charge value with opposite polarity that the ripple current, the magnitude of the ripple current is changed by the characteristic fluctuation in charge pump circuit 135 and temperature fluctuation, so that canceling the ripple current accurately with the compensation current is difficult. Therefore, there is the problem of not being able to completely eliminate the spurious components contained in external output signal (OUT).

The present invention was designed to solve said drawbacks of the conventional technology and its objective is to provide a frequency synthesizer of favorable characteristics in which spurious components are not included in the output signals.

SUMMARY OF THE INVENTION

In order to solve said problems, the invention in claim 1 is a frequency synthesizer which has an oscillator which outputs external output signals, a frequency divider which generates a comparison signal by frequency dividing the external output signal output by said oscillator while changing the frequency division value cyclically, a phase comparing circuit which outputs a phase shift signal by comparing the phase of said comparison signal and the phase of the reference clock signal, a charge pump circuit which feeds a control signal complying with said phase difference signal to said oscillator so that the frequency of said external output signal is equal to the frequency of said reference clock signal multiplied by the average frequency division value, an automatic reference correcting circuit which measures the ripple component originating in the ripple current contained in said control signal, and a ripple correcting circuit which forms a compensation current of opposite polarity than said ripple current based on the measured result of said ripple component and superimposes it on said control signal.

Another aspect of the invention is composed so that said automatic reference correcting circuit includes a control circuit which stores the measured result of said ripple component and said ripple correcting circuit forms said compensation current based on the output signal of said control circuit.

A further aspect of the invention is composed so that measurement of said ripple component and formation of said compensation current are executed repeatedly.

Yet another aspect of the invention includes said automatic reference correcting circuit being composed to output an output signal complying with the stored content in said control circuit to said ripple correcting circuit.

A further aspect of the invention is composed so that the superimposition of said compensation current on said control signal is executed after the frequency of said external output signal has stabilized within a prescribed range.

The frequency synthesizer of the present invention is composed as described above, the external output signal output by the oscillator is frequency divided and a comparison signal is formed according to a frequency divider in which the frequency division value is changed cyclically, the phase comparator obtains the phase difference by examining the phase of the comparison signal and the reference clock signal, the charge pump circuit outputs a control signal complying with the phase difference to said oscillator, and after a predetermined time from the start of operation, the frequency of the external output signal is equal to the frequency of the reference clock signal multiplied by the average frequency division value.

Also, the output of said frequency synthesizer contains the ripple current from the charge pump circuit even after the frequency of output signal (OUT) has been locked, so that it has an automatic reference correcting circuit, which measures the ripple component formed by the ripple current and contained in the control signal, and a ripple correcting circuit designed to form a compensation current based on the measurements of the ripple component which can be superimposed on the control signal in order to be able to change the charge value of the compensation current according to the magnitude of the ripple component. Therefore, it is not necessary to set the charge value of the compensation current by measuring the magnitude of the ripple component beforehand, and even if the magnitude of the ripple component changes due to temperature changes, etc., it is possible to adjust the charge value of the compensation current in accordance with said change.

With this type of frequency synthesizer, it becomes possible to form a negative feedback loop which gradually minimizes the ripple component by repeatedly measuring the ripple component and forms a compensation current based on the measurement results after the frequency of the external output signal converges to some extent near the value equal to the frequency of the reference clock signal multiplied by the average frequency division value (lock up) after the start of the operation.

Also, by providing a control circuit which stores the measured result of the ripple component in the automatic reference correcting circuit and by designing the ripple correcting circuit to be able to form a compensation current signal based on the output signal of the control circuit, it is possible to accurately stabilize the frequency of the external output signal to a value equal to the frequency of the reference clock signal multiplied by the average frequency division value in a short time if the measurement results are stored by control circuit when a negative feedback loop has been formed, and a signal which further minimizes the ripple component is obtained after the ripple component has been minimized to some extent, which is then output to the ripple correcting circuit.

REFERENCE NUMERALS AS SHOWN IN THE DRAWINGS

1 represents a frequency synthesizer, 4 an automatic reference correcting circuit, 31 an oscillator, 32 a frequency divider, 33 a clock signal generator, 34 a phase comparator, 35 a charge pump circuit, 36 a low-pass filter, 38 a fractional frequency division control circuit, 39 a ripple correcting circuit, 53 an A/D converter, 55 a control circuit, 56 a D/A converter, 74 a ripple component.

DESCRIPTION OF THE EMBODIMENTS

Figure 1:
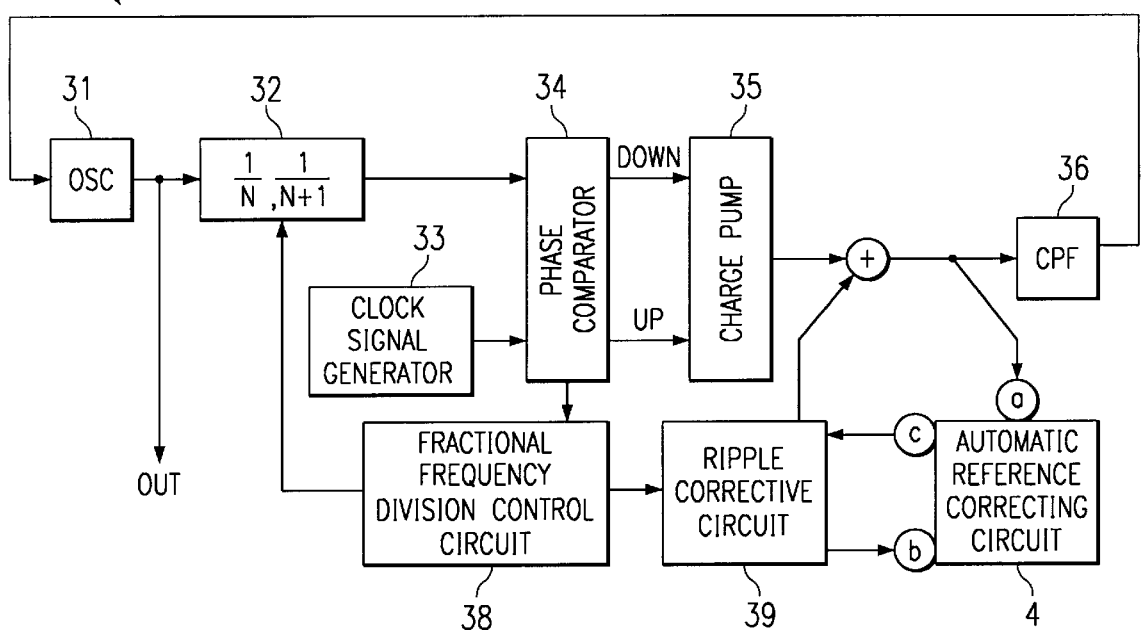
FIG. 1 is a block diagram showing an example of the frequency synthesizer of the present invention.

In FIG. 1, code 1 indicates an example of the frequency synthesizer of the present invention which is provided in a semiconductor device.

This frequency synthesizer 1 has automatic reference correcting circuit 4, oscillator 31, frequency divider 32, clock signal generator 33, phase comparator 34, charge pump circuit 35, low-pass filter 36, fractional frequency division control circuit 38, and ripple correcting circuit 39.

External output signal (OUT) output by oscillator 31 is output to frequency divider 32 and is also fed to other circuits within the semiconductor device provided with this frequency synthesizer 1.

Frequency divider 32 frequency divides input external output signal (OUT), forms a low-frequency compensation signal, which is output to phase comparator 34. Also, clock signal generator 33 forms a reference clock signal of prescribed frequency which is output to phase comparator 34.

Phase comparator 34 obtains the phase difference by comparing the phase of the comparison signal and the reference clock signal and outputs signal Up or signal Down to charge pump circuit 35 for only the time complying with the phase shift when the comparison signal respectively lags or leads the reference clock signal.

The output terminal of charge pump circuit 35 is connected to the input terminal of oscillator 31 via low-pass filter 36, feeds current to the low-pass filter 36 side from the power supply voltage line when signal Up is input, and, on the other hand, forms a control signal by extracting current from the low-pass filter 36 side when signal Down is input. This control signal is input to oscillator 31 after the high frequency component is removed by low-pass filter 36.

Oscillator 31 is designed so that the frequency of external output signals (OUT) will be low when the voltage of the input control signal decreases and high when the voltage increases. When the comparison signal and the reference clock signal are in phase, neither signal Up nor signal Down is output from charge pump circuit 35, so that if the frequency division value of frequency divider 32 is fixed, external output signal (OUT) stabilizes when the frequency becomes equal to the frequency of the reference clock signal multiplied by the frequency division value.

For example, in the case of PHS, it is necessary to generate external output signals (OUT) of 300 kHz step of channel intervals centered in the vicinity of 1.6 Ghz. Therefore, in this frequency synthesizer 1, the frequency division value of frequency divider 32 is changed cyclically according to fractional frequency division control circuit 38 and is designed so that the frequency of external output signal (OUT) will be stabilized to a value equal to the frequency of the reference clock signal multiplied by the average frequency division value after frequency synthesizer 1 starts operation and a prescribed time has passed (after being locked up).

Figure 3:
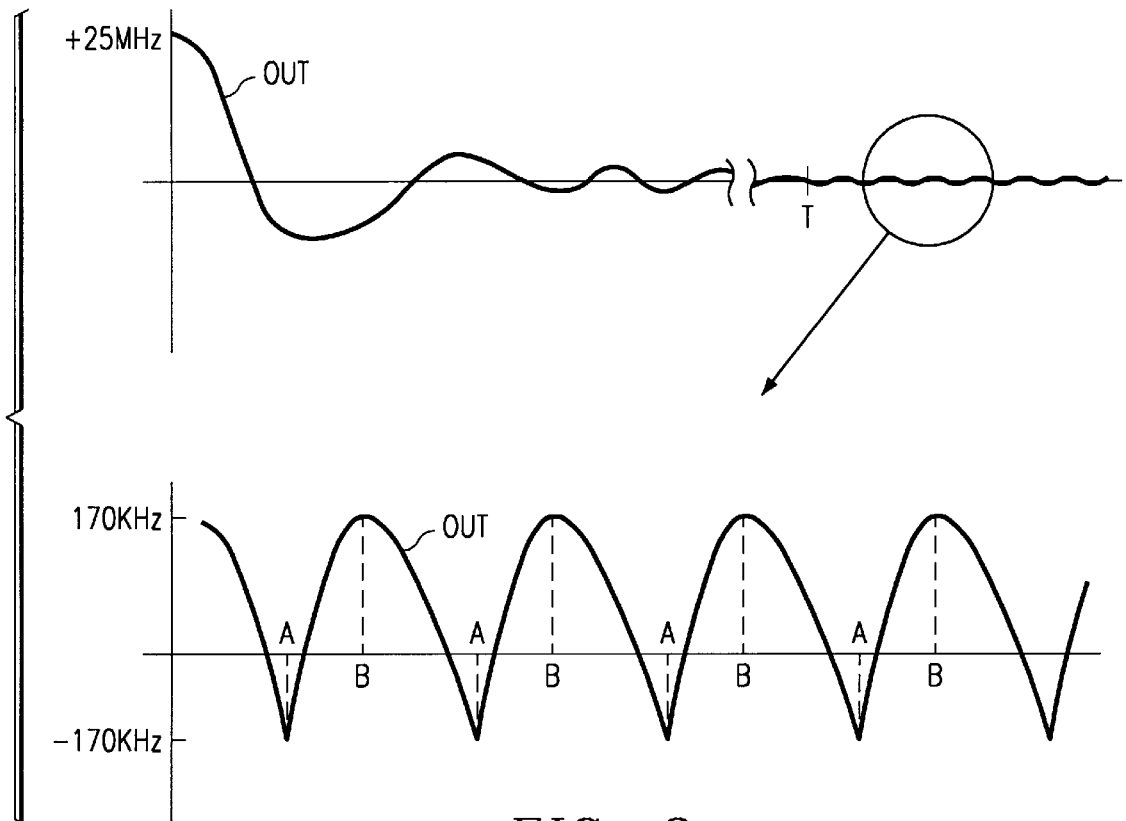
FIG. 3 is a graph for explaining the convergence of external output signals (OUT).

The graph at the top in FIG. 3 shows the frequency change in external output signal (OUT) after starting the operation in frequency synthesizer 1. The frequency of external output signal (OUT) gradually converges and locks up when time (T) has passed.

Figure 4:
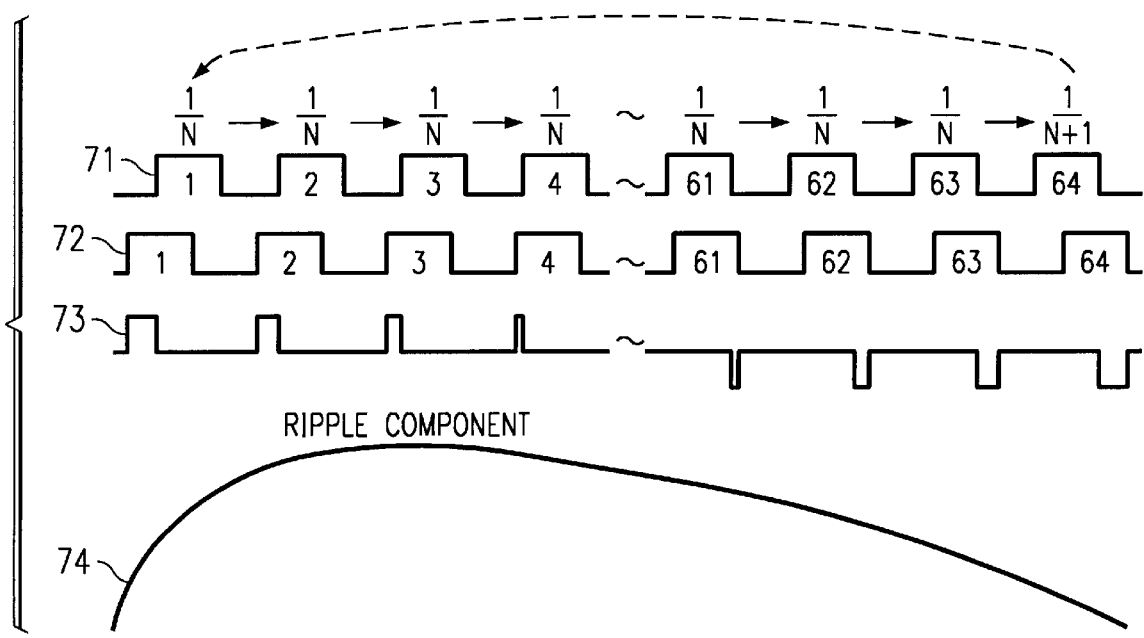
FIG. 4 is a timing diagram for the internal signals of the frequency synthesizer after a prescribed time has passed from start of operation.

Codes 71–74 in FIG. 4 respectively indicate the comparison signal output from frequency divider 32, the reference signal, and the phase difference of these signals after the lock up, and ripple component contained in the control signal output from charge pump circuit 35. This graph is an example of changing the frequency division value with 64 cycles of the reference clock signal as a unit and is a case which made the frequency division value for the period of 63 cycles out of the 64 cycles as N and only the period of 1 cycle as N+1.

As is apparent from FIG. 4, the phase of the comparison signal output from frequency divider 32 gradually progresses during the 63 cycles in which the frequency division value of frequency divider 32 is N and is delayed all at once when the frequency division value become N+1. Phase difference 73 is generated while the phase comparison is being executed. Therefore, ripple current complying with the size of phase difference 73 is output from charge pump circuit 35 even after the lock up and ripple component 74 (indicated by the voltage value) is generated when the ripple current is input to low-pass filter 36.

If the charge value of the ripple current corresponding to the smallest phase difference from phase differences 73 during the 64 cycles of the reference clock signal is assumed to be ±ΔQ, the magnitude of the ripple current during the 64 cycles becomes a charge value of ΔQ interval at ±ΔQ to ±32ΔQ according to the magnitude of phase difference 73.

Oscillator 31 is designed to make the frequency of external output signal (OUT) high when the voltage of the control signal input from charge pump circuit 35 becomes high and low when the voltage becomes low, so that if the peak-to-peak voltage of the ripple component is 5 mV, the frequency of external output signal (OUT) changes cyclically in width of ±170 kHz, even after locking, as indicated in the graph at the bottom part of FIG. 3.

Figure 2:
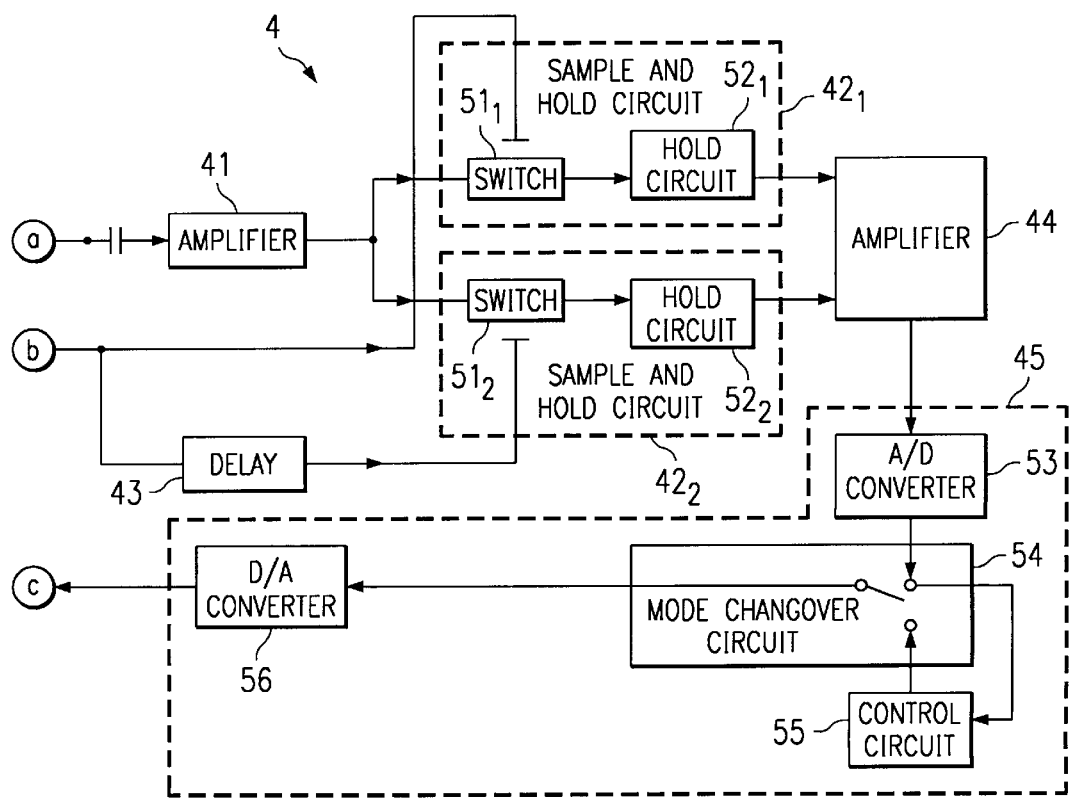
FIG. 2 is an internal block diagram of an automatic reference correcting circuit.

In this frequency synthesizer 1, the output of charge pump circuit 35 is also input to automatic reference correcting circuit 4. Automatic reference correcting circuit 4 has voltage generating circuit 45, delay circuit 43, amplifiers 41 and 44, and first and second sample-and-hold circuits $42_1$ and $42_2$ in reference to FIG. 2. Within first and second sample-and-hold circuits $42_1$ and $42_2$, first and second switches $51_1$ and $51_2$ and first and second hold circuits $52_1$ and $52_2$ are provided, and within voltage generating circuit 45, A/D converter 53, mode changeover unit 54, control circuit 55, and D/A converter 56 are provided.

The control signal output from charge pump circuit 35 is input to amplifier 41 in the input step with the DC component removed. The output terminal of this amplifier 41 is connected to first and second hold circuits $52_1$ and $52_2$ via first and second switch circuits $51_1$ and $51_2$ and is designed so that the AC voltage component amplified by amplifier 41 is respectively input into first and second hold circuits $52_1$ and $52_2$ via first and second switches $51_1$ and $51_2$.

Here, if the frequency division value is N during the 63 cycles of the reference clock signal and N+1 during 1 cycle, the ripple component has the lowest potential when external output signal (OUT) is frequency divided with frequency division value N+1. If the time at this time is expressed by code A and the time when the ripple has become the highest potential is expressed by code B, the frequency of external output signal (OUT) is lowest at time A and highest at time B. Output of ripple correcting circuit 39 is directly input into first switch $51_1$ of first and second switches $51_1$ and $51_2$ and is input to second switch $51_2$ via delay circuit 43.

Figure 5:
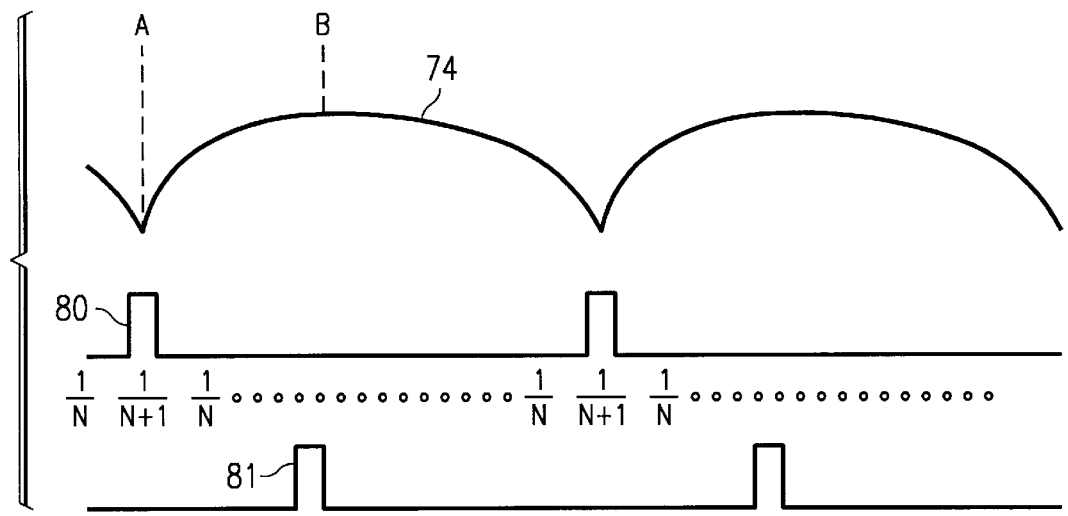
FIG. 5 is a graph for explaining the timing of the ripple component.
Figure 6:
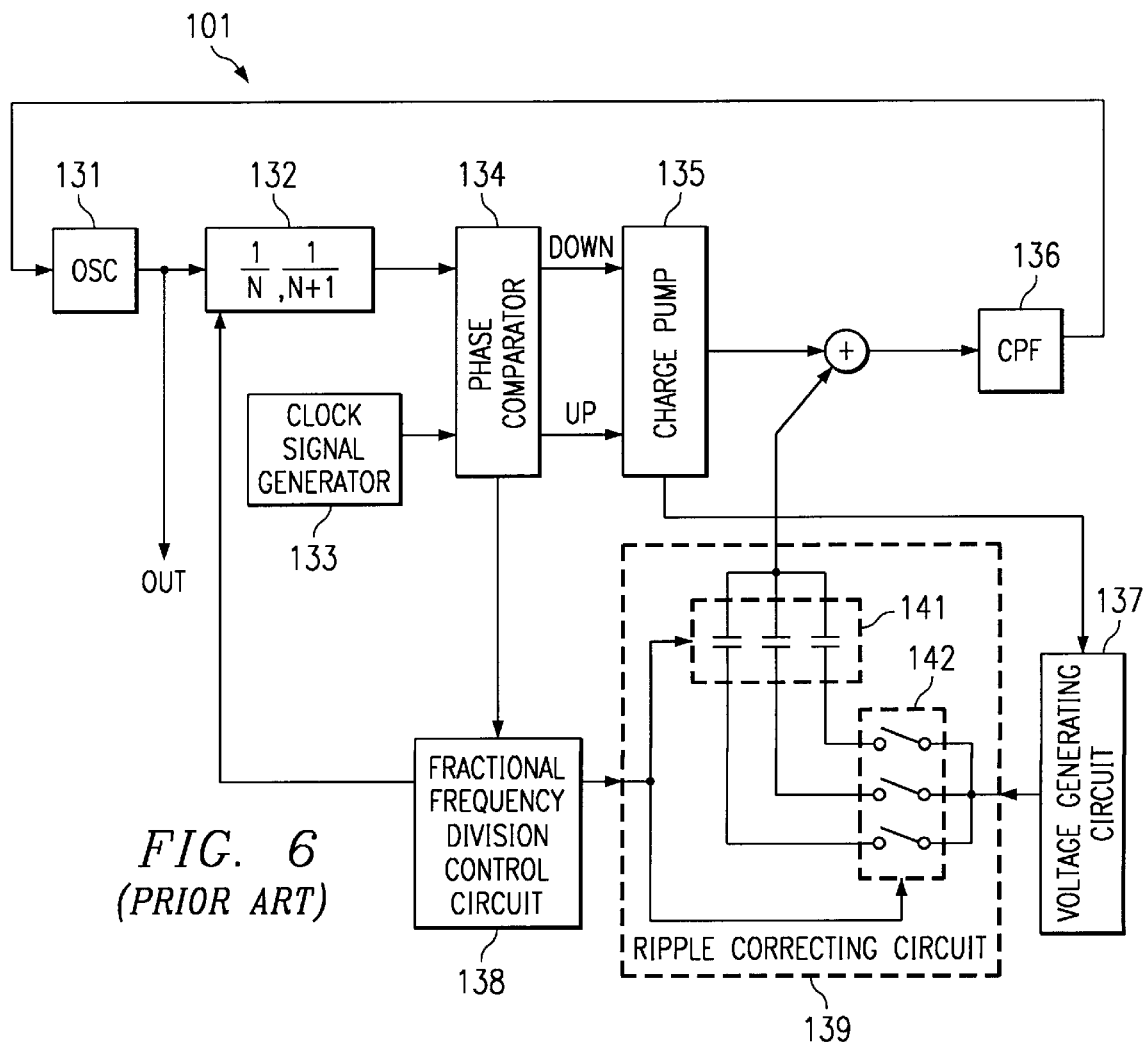
FIG. 6 is a block diagram for a frequency synthesizer of the conventional technology.
Figure 7:
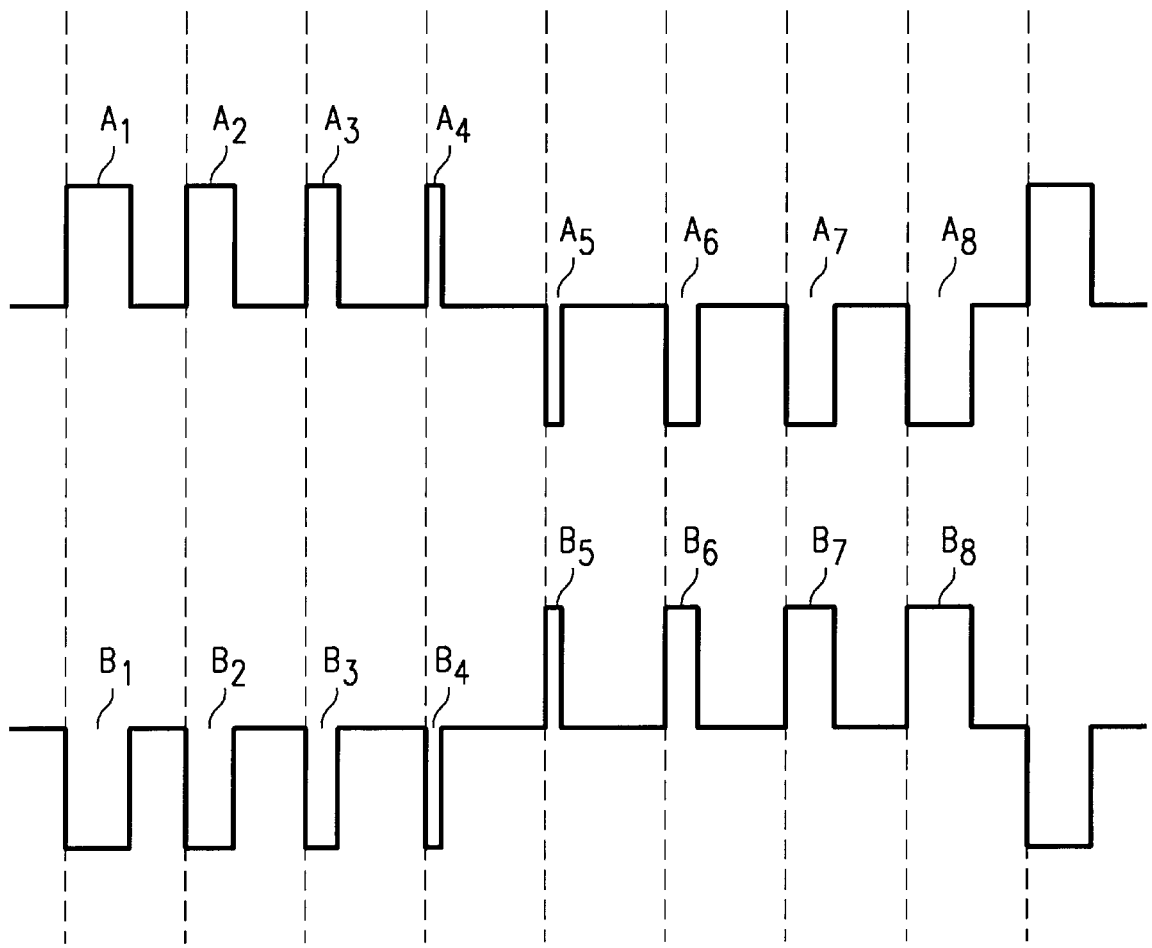
FIG. 7 is a timing diagram for explaining the ripple current and compensation current.

Ripple correcting circuit 39 is controlled by fractional frequency division control circuit 38, and when pulse-like signal 80 is formed at time A as shown in FIG. 5 according to the signal from fractional frequency division control circuit 80, pulse-like signal 80 is input directly to first switch $51_1$.

First switch $51_1$ is closed when pulse-like signal 80 is input, first hold circuit $52_1$ and amplifier 41 are connected, and amplified ripple component 74 is input to hold circuit $52_1$. At time A, ripple component 74 has the lowest potential, so that this lowest potential is held in first hold circuit $52_1$.

Also, pulse-like signal 80 input at time A is delayed by delay circuit 43, becomes pulse-like signal 81 at time B, and is input to the second switch circuit $51_2$. When second switch circuit $51_2$ is closed according to pulse-like signal 81, second hold circuit $52_2$ and amplifier 41 are connected, and amplified ripple component 74 is input to second hold circuit $52_2$. At time B, ripple component 74 has the highest potential, so that this highest potential is held according to second hold circuit $52_2$.

The potentials held by first and second hold circuits $52_1$ and $52_2$ are input to amplifier 44 in the later stage, differentially amplified, and the output of said amplifier 44 is input to A/D converter 53 in voltage generating circuit 45.

Therefore, the voltage value of the ripple component is input to A/D converter 53 in a differentially amplified state.

A/D converter 53 converts the input voltage value into a digital value which is output to control circuit 55 and mode changeover unit 54.

Control circuit 55 stores and internally processes the input digital signal and outputs the processed result thereof to mode changeover unit 54. Mode changeover unit 54 is designed to output either the digital signal input from control circuit 55 or digital signal input from A/D converter 53 to D/A converter 56.

Mode changeover unit 54 outputs the digital signal input from A/D converter 53 to D/A converter 56 immediately after external output signal (OUT) has been locked.

D/A converter 56 converts the digital signal into an analog signal and outputs it to ripple correcting circuit 39. Ripple correcting circuit 39 is composed to form compensation current of a charge value corresponding with the magnitude of the analog signal input from the D/A converter and to superimpose it on the control signal output by charge pump circuit 35. The ripple component decreases as a result of superimposing the compensation current, but the ripple component is measured by automatic reference correcting circuit 4 as described above, the measured result is stored in control circuit 55 along with analog signal corresponding to the measured result being output to ripple correcting circuit 39 from D/A converter 56, and the compensation current of a change value which was corrected is superimposed on the output of charge pump circuit 35.

As described above, the measured result is amplified after the ripple component has been measured and is reflected in the charge value of the compensation current which is of opposite polarity from the ripple current, so that a negative feedback loop which gradually minimizes the ripple component is formed by automatic reference correcting circuit 4 and ripple correcting circuit 39.

Then, the digital signals output from A/D converter 53 are stored in control circuit 55 while the negative feedback loop is being formed and after control circuit 55 obtains a digital signal suitable for making the ripple component the smallest from the stored content, mode changeover unit 54 is switched and when the digital signal output from control circuit 55 is input to D/A converter 56, a compensation current with a charge value complying with the digital signal is formed in ripple correcting circuit 39.

Therefore, the ripple component becomes very small and the frequency of external output signal (OUT) stabilizes to a frequency equal to the reference signal multiplied by the average frequency division value of frequency divider 32. If the ripple current at this time is being generated with charge values of $\pm\Delta Q$ to $\pm 32\Delta Q$ ($32\Delta Q \to 31\Delta Q \to \ldots \Delta Q \to -\Delta Q \to -2\Delta Q \to \ldots -32\Delta Q$) every time a phase comparison is executed with 64 cycles of reference clock signal as a unit, compensation current of a charge value equal to the change value of the ripple current is output for each phase comparison from ripple correcting circuit 39 with the opposite polarity.

When using said frequency synthesizer 1 in a cellular telephone, compensation current which can accurately cancel the ripple current after the change is formed even if the ripple current is changed due to the influence of temperature fluctuations, etc., when the aforementioned operation is executed after the power is input, so that the frequency of external output signal (OUT) can be stabilized.

Also, if a ripple current fluctuation factor such as temperature fluctuation, etc., is created, it is possible to reset the compensation current even after power is input. The ripple component can be eliminated accurately, so that external output signals which do not have spurious components can be obtained.

What is claimed is:

1. A frequency synthesizer comprising an oscillator for generating external output signals, a frequency divider which generates a comparison signal by frequency dividing the external output signal from said oscillator and cyclically changing its frequency division value, a phase comparing circuit for generating a phase difference signal by comparing the phase of said comparison signal and the phase of a reference clock signal, a charge pump circuit for feeding a control signal complying with said phase difference signal to said oscillator so that the frequency of said external output signal is equal to the frequency of said reference clock signal multiplied by an average frequency division value, an automatic reference correcting circuit for measuring a ripple component originating in a ripple current contained in said control signal, and a ripple correcting circuit forming a compensation current of opposite polarity than said ripple current based on the measured result of said ripple component and superimposes it on said control signal.

2. The frequency synthesizer of claim 1 wherein said automatic reference correcting circuit includes a control circuit for storing the measured result of said ripple component and said ripple correcting circuit forms said compensation current based on the output signal of said control circuit.

3. The frequency synthesizer of claim 2 wherein the measurement of said ripple component and the formation of said compensation current are executed repeatedly.

4. The frequency synthesizer of claim 3 wherein said automatic reference correcting circuit generates an output signal complying with the stored contents of said control circuit to said ripple correcting circuit.

5. The frequency synthesizer of claim 3 wherein the superimposition of said compensation current on said control signal is executed after the frequency of said external output signal has stabilized within a prescribed range.

6. The frequency synthesizer of claim 2 wherein said automatic reference correcting circuit generates an output signal complying with the stored contents of said control circuit to said ripple correcting circuit.

7. The frequency synthesizer of claim 6 wherein the superimposition of said compensation current on said control signal is executed after the frequency of said external output signal has stabilized within a prescribed range.

8. The frequency synthesizer of claim 2 wherein the superimposition of said compensation current on said control signal is executed after the frequency of said external output signal has stabilized within a prescribed range.

9. The frequency synthesizer of claim 1 wherein the superimposition of said compensation current on said control signal is executed after the frequency of said external output signal has stabilized within a prescribed range.

* * * * *